United States Patent [19]
Hochgraef et al.

[11] Patent Number: 6,147,847
[45] Date of Patent: Nov. 14, 2000

[54] CIRCUIT ARRANGEMENT FOR DETECTING THE CURRENT OF A CURRENT CONDUCTOR IN ORDER TO ACTIVATE ELECTRONICALLY CONTROLLABLE TRIPPING DEVICES

[75] Inventors: Holger Hochgraef, Wusterhausen; Mario Wegener, Berlin, both of Germany

[73] Assignee: Siemens Aktiengesellschaft, Munich, Germany

[21] Appl. No.: 09/147,904

[22] PCT Filed: Sep. 24, 1997

[86] PCT No.: PCT/DE97/02216

§ 371 Date: Jun. 24, 1999

§ 102(e) Date: Jun. 24, 1999

[87] PCT Pub. No.: WO98/13921

PCT Pub. Date: Apr. 2, 1998

[30] Foreign Application Priority Data

Sep. 24, 1996 [DE] Germany ............... 196 41 183

[51] Int. Cl.[7] ...................................... H02H 3/00
[52] U.S. Cl. ................ 361/93.2; 361/93.1; 700/292
[58] Field of Search .................... 361/78, 79, 86, 361/87, 93.1, 93.2, 93.3; 324/509, 522; 700/292–293, 297–298, 79

[56] References Cited

U.S. PATENT DOCUMENTS

| | | | |
|---|---|---|---|
| 4,713,608 | 12/1987 | Catiller et al. | 324/142 |
| 5,179,495 | 1/1993 | Zuzuly | 361/94 |
| 5,283,708 | 2/1994 | Waltz | 361/93 |

FOREIGN PATENT DOCUMENTS

| | | |
|---|---|---|
| 0 469 207 | 2/1992 | European Pat. Off. . |
| 0 515 712 | 12/1992 | European Pat. Off. . |
| 0 687 050 | 12/1995 | European Pat. Off. . |
| 32 23 687 | 1/1984 | Germany . |
| 2 008 345 | 5/1979 | United Kingdom . |
| WO 90/12352 | 10/1990 | WIPO . |

*Primary Examiner*—Josie Ballato
*Assistant Examiner*—Kim Huynh
*Attorney, Agent, or Firm*—Kenyon Kenyon

[57] ABSTRACT

A circuit arrangement for detecting the current of a current conductor in order to activate electronically controllable tripping devices, having a line voltage supply unit, with the operating voltage generated by the line voltage supply unit being compared to a reference voltage and the tripping device being activated by a limit voltage that forms when an overcurrent occurs. The a.c. voltage transmitted via secondary phase windings is rectified and supplied to a microprocessor device in the form of an operating voltage by the phases that are not in the measuring state. The processor-controlled phase measurement is performed without load, producing a precise measurement result.

4 Claims, 2 Drawing Sheets

CIRCUIT ARRANGEMENT FOR DETECTING THE CURRENT OF A CURRENT CONDUCTOR IN ORDER TO ACTIVATE ELECTRONICALLY CONTROLLABLE TRIPPING DEVICES

FIELD OF THE INVENTION

The present invention relates to a circuit arrangement for detecting the current of current conductors, having one secondary phase winding per current conductor in order to activate electronically controllable tripping devices, having a line voltage supply device, with the operating voltage generated by the line voltage supply unit being compared to a reference voltage and the tripping device being activated by a limit voltage that forms when an overcurrent is reached; and a measuring potential input being provided for each secondary phase winding, with the measuring voltages being tapped by load resistors that are connected to the negative outputs of rectifiers, and each secondary phase winding being connected to a common voltage-stabilized Zener diode via a downstream diode, and the operating voltage being supplied by a charging capacitor.

BACKGROUND INFORMATION

European Patent No. 0 469 207 describes a circuit arrangement that is equipped with load resistors which are assigned to current conductors and provide a separate measuring potential input for each secondary phase winding. Diodes that establish a connection to the common voltage-stabilized Zener diode and supply the operating voltage via a charging capacitor are connected downstream from the secondary windings. Generation of the operating voltage is decoupled from generation of the measuring signals by diodes.

As described in World Patent No. 90/12342, decoupling is also achieved by bypass circuits, in which the power supply system is decoupled from the current peak values to be measured.

As described in European Patent Application No. 0 687 050 the operating voltage is generated and the current detected by analog-controlled switching elements which are also supplied individually for each current conductor. In this regard, pure a.c. measurements using evaluation circuits are also described in which a separate load resistor is provided for each current conductor. Because the load resistors also have resistance values that are subject to specific tolerances, the measurement results obtained during current detection are imprecise.

Furthermore, a power supply unit for overcurrent tripping devices which control the necessary operating voltage in conjunction with a microprocessor is described in German Patent Application No. 32 23 687. However, the measuring circuit used in this case to detect the current is not decoupled from the circuit for generating the operating voltage, which means that mutual disturbances occur, resulting in imprecise measurement results.

SUMMARY

An object of the present invention is to provide a circuit arrangement for detecting the current of current conductors which reduces the amount of costly high-precision components, in particular load resistors, and also considerably improves the measurement procedure used for current detection and evaluation.

According to the present invention, this object is achieved by the following features including:

the circuit arrangement has a microprocessor device with a number of measuring potential inputs equal to the number of secondary phase windings;

each secondary phase winding is connected to a multiway rectifier device, whose positive outputs are connected to an input of a regulating transistor via a corresponding downstream diode;

the negative outputs of the multiway rectifier devices are all connected to one output of the regulating transistor, which is connected in an electrically conductive manner to a supply voltage output of the microprocessor device and a terminal of one load resistor;

a further terminal of the one load resistor simultaneously forms the first inputs of a number of measuring transistors equal to the number of secondary phase windings and a common line potential input of the microprocessor device;

the second inputs of the measuring transistors are each connected to the corresponding positive outputs of the corresponding multiway rectifier devices;

the operating voltage is supplied to a supply voltage input of the microprocessor device by a voltage regulator device;

the control inputs of the measuring transistors are each connected to a corresponding measuring potential input so that only one measuring transistor can be switched for detecting the current.

The use of the microprocessor device, which effectively helps regulate the operating voltage, allows the current to be detected by an interrupt-controlled background process. Unlike the present analog-controlled measurement sampling systems and voltage regulators, the microprocessor device controls the regulated operating voltage so that the a.c. voltage component of one secondary phase winding selected by the microprocessor device for current detection is the one not used for generating the operating voltage at the time of the measurement. The result is much more accurate when the line voltage of the secondary phase winding is off-load. Another important aspect of the present invention is that the circuit arrangement needs only one load resistor as a precision component with a high electrical load capacity, for the microprocessor device requires only one measuring channel for the internal measurement procedure. While the internal controller of the microprocessor device selects the a.c. voltage of one secondary winding in order to detect the current, the other a.c. voltages of the remaining secondary phase windings are available for generating the operating voltage. Unlike the analog-controlled switching operations, current detection and operating voltage generation take place in a synchronized sequence in this case.

One advantageous embodiment of the present invention includes the following feature:

the measuring transistors can be controlled so that they replace the function of the regulating transistor, making it possible to eliminate the additional regulating circuit.

A further advantageous embodiment of the present invention includes the following feature:

the measuring transistors can be controlled so that they replace the function of the voltage regulator device.

This makes it possible to further reduce the number of switching elements without any negative effect on the measurement result when the measuring transistors are activated accordingly.

DETAILED DESCRIPTION

Figure 1:
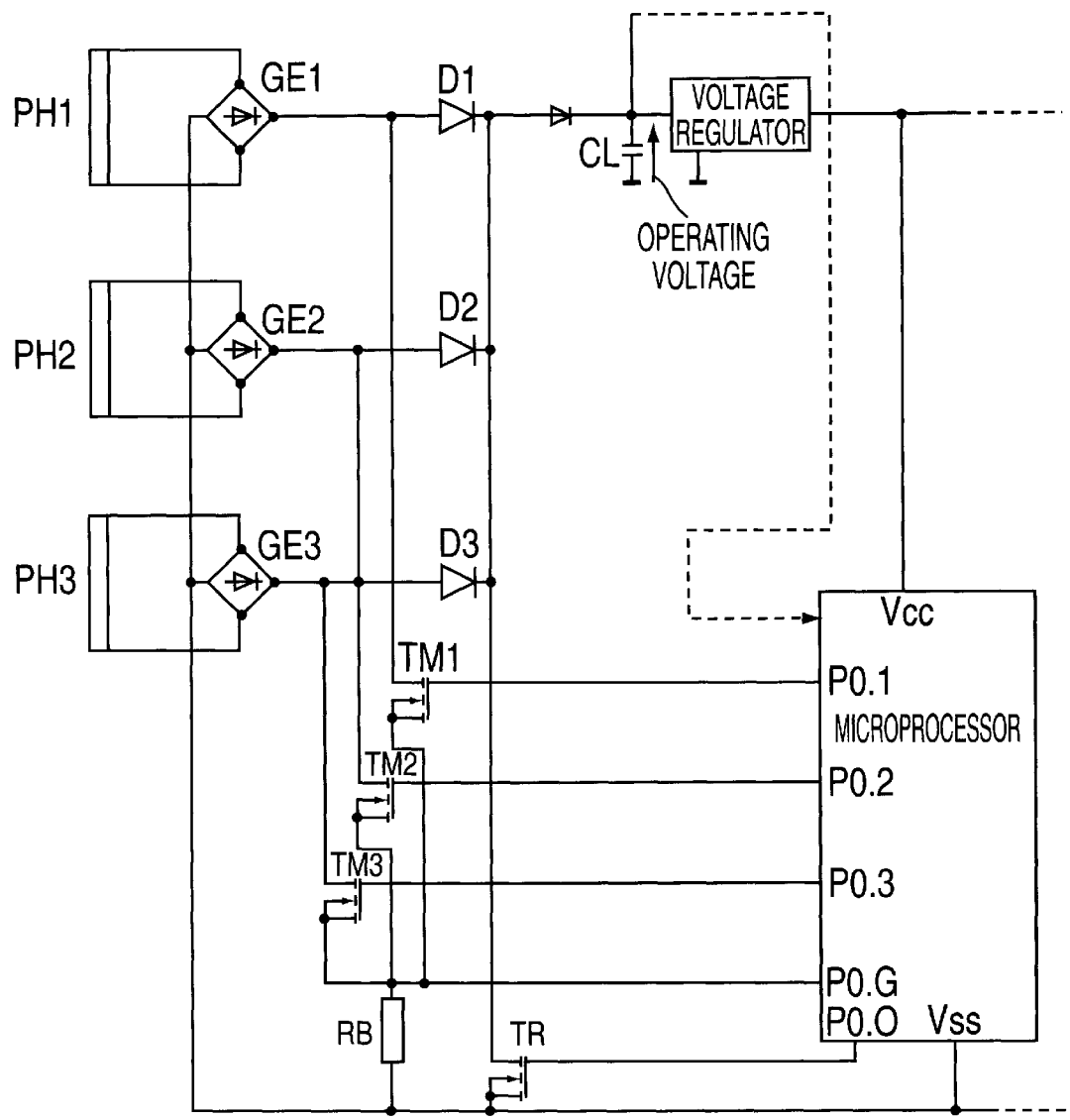
FIG. 1 illustrates a schematic of a current detection arrangement according to an embodiment of the present invention.

The line voltage supply unit illustrated in FIG. 1 has, for example, first, second and third phase windings PH1–3, whose a.c. voltages are rectified by corresponding downstream first, second, and third multiway rectifier devices GE1–3 and switched to a common operating voltage charging capacitor CL via first, second, and third diodes D1–3. This arrangement is simultaneously connected to a load electrode of regulating transistor TR. Operating voltage UB, which forms at the operating voltage charging capacitor CL, is connected to voltage regulator device SRE, whose output leads to supply voltage terminal Vcc of microprocessor device MPE. The positive output of each first, second, and third multiway rectifier device GE1–3 is connected in an electrically conductive manner to a corresponding load electrode of first, second, and third measuring transistors TM1–3, whose control inputs are conductively connected to corresponding first, second, and third measuring potential port P0.1–0.3 of microprocessor device MPE. The illustration also shows that two conductively interconnected inputs of each measuring transistor TM1–3 lead to a common measuring potential port P0.G of microprocessor device MPE. The one load resistor RB used for the measurement is located between line potential port P0.G and supply voltage terminal Vss of microprocessor device MPE. The control input of regulating transistor TR is connected to measuring potential port P0.0, while the interconnected inputs of regulating transistor TR also lead to supply voltage terminal Vss of microprocessor device MPE. As described above, the microprocessor device is used to regulate the operating voltage as a supply voltage which can be used to calculate the current detection for the current conductors of the line voltage supply system in practice in timed intervals.

Figure 2:
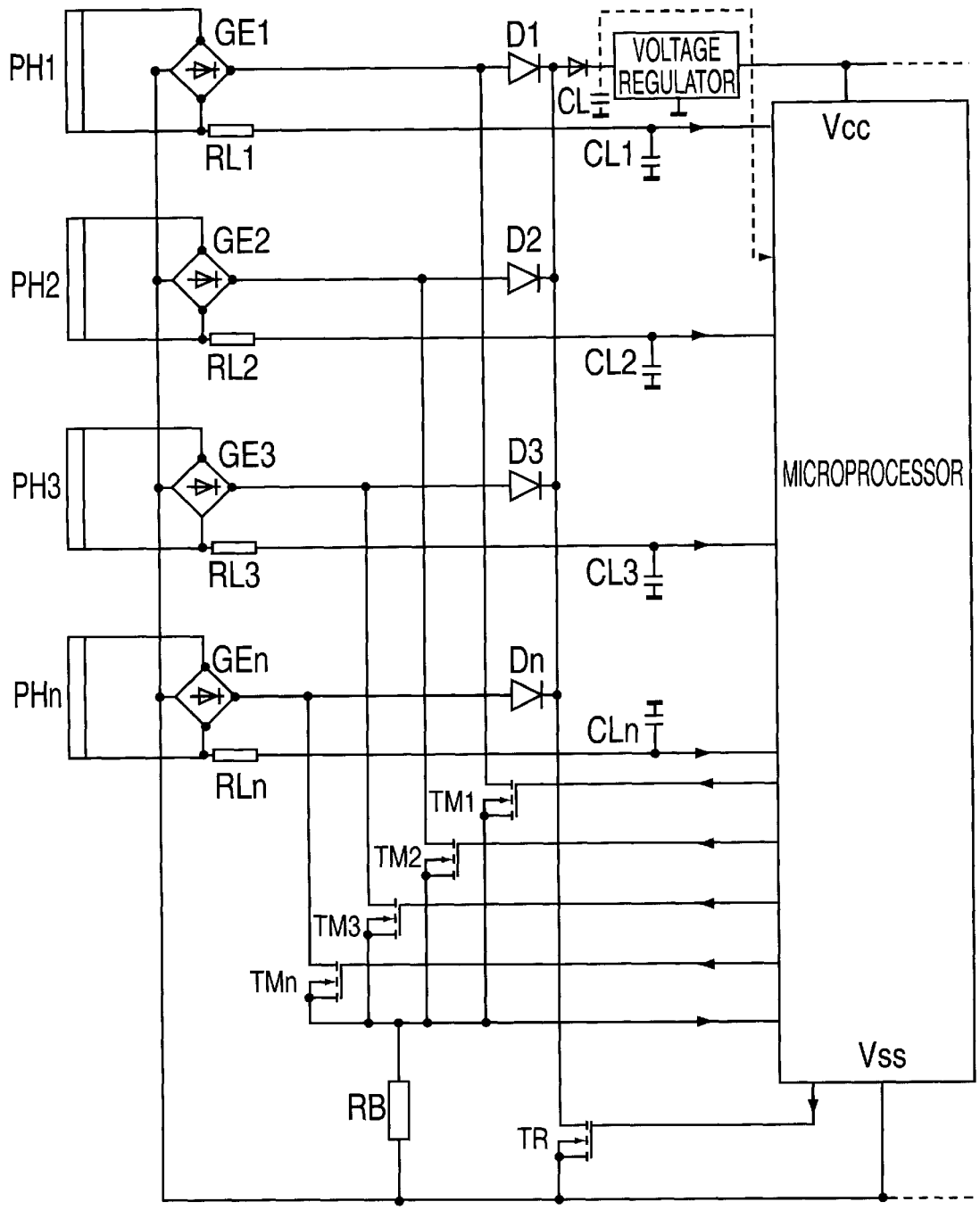
FIG. 2 illustrates a schematic of a current detection arrangement according to another embodiment of the present invention.

FIG. 2 shows another embodiment of the circuit arrangement for detecting the current of current conductors according to the present invention. A difference between this embodiment and the one shown in FIG. 1 is that, in the line current supply system shown in FIG. 2, the neutral conductor is also monitored via secondary winding PHn to detect an overcurrent that occurs in the event of a fault. In conjunction with corresponding first, second, third, and nth charging capacitor CL1–n, line resistors RL1–n are used to transmit an additional a.c. voltage to a.c. voltage inputs (not illustrated) of microprocessor device MPE in order to calculate the currents flowing through the current conductors.

What is claimed is:

1. A circuit arrangement for detecting current of current conductors, comprising:

secondary phase windings, a respective one of the secondary phase windings being provided for each of the current conductors;

full-wave rectifier devices having positive outputs and negative outputs, each of secondary phase windings being coupled to a corresponding one of the full-wave rectifier devices;

a regulating transistor having a control electrode and first and second load electrodes, each of the positive outputs of the full-wave rectifier devices being coupled to the second load electrode of the regulating transistor via a corresponding downstream diode, the negative outputs of the full-wave rectifier devices being coupled to the first load electrode of the regulating transistor;

a microprocessor device having measuring potential ports, a common measuring potential port and a regulating control port, first and second supply voltage terminals, a number of the measuring potential ports equaling the number of secondary phase windings, the first load electrode of the regulating transistor being coupled to the first supply voltage terminal of the microprocessor device, the control electrode of the regulating transistor being connected to the regulating control port of the microprocessor device;

measuring transistors having a control electrode and first and second load electrodes, a number of measuring transistors equaling the number of secondary phase windings, each of the second load electrodes of the measuring transistors being coupled to the positive outputs of respective ones of the full-wave rectifier devices, the control electrodes of the measuring transistors being coupled to the measuring potential ports of the microprocessor device such that the measuring transistors can be switched individually for detecting the current;

a load or burden resistor having a first terminal and a second terminal, the first load electrode of the regulating transistor being coupled to the first terminal of the load or burden resistor, the second terminal of the load or burden resistor coupled to the first load electrodes of the measuring transistors, the second terminal of the load resistor further being coupled to the common measuring potential port of the microprocessor device; and a voltage regulator device coupled to the second supply voltage terminal of the microprocessor device, the voltage regulator device supplying an operating voltage to the microprocessor device via a charging capacitor.

2. The circuit arrangement according to claim 1, wherein the circuit arrangement activates electronically controllable tripping devices, the tripping device being activated by a limit voltage that forms when an overcurrent is reached.

3. The circuit arrangement according to claim 1, wherein the measuring transistors function as the regulating transistor.

4. The circuit arrangement according to claim 1, wherein the measuring transistors function as the voltage regulator device.

* * * * *